(12) United States Patent
Lee et al.

(10) Patent No.: US 12,137,590 B2
(45) Date of Patent: Nov. 5, 2024

(54) DISPLAY DEVICE

(71) Applicant: Samsung Display Co., Ltd., Yongin-si (KR)

(72) Inventors: Seho Lee, Yongin-si (KR); Taehyung Kim, Yongin-si (KR); Yongdae Lee, Yongin-si (KR); Hyoyeon Kim, Yongin-si (KR); Taehyeon Yang, Yongin-si (KR); Chulsoon Lee, Yongin-si (KR); Changgwi Jin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 289 days.

(21) Appl. No.: 17/504,444

(22) Filed: Oct. 18, 2021

(65) Prior Publication Data

US 2022/0254864 A1 Aug. 11, 2022

(30) Foreign Application Priority Data

Feb. 10, 2021 (KR) .................. 10-2021-0019362

(51) Int. Cl.
*H10K 59/131* (2023.01)
*H10K 59/122* (2023.01)
*H10K 71/00* (2023.01)
*H10K 59/12* (2023.01)

(52) U.S. Cl.
CPC ....... *H10K 59/1315* (2023.02); *H10K 59/122* (2023.02); *H10K 71/00* (2023.02); *H10K 59/1201* (2023.02)

(58) Field of Classification Search
None
See application file for complete search history.

(56) References Cited

U.S. PATENT DOCUMENTS

| 9,076,983 B2 | 7/2015 | Kim et al. |
| 9,349,784 B2 | 5/2016 | Lee et al. |
| 9,362,345 B2 | 6/2016 | Jeong et al. |
| 9,780,158 B2 * | 10/2017 | Lee .................. H10K 71/00 |
| 2014/0239262 A1 * | 8/2014 | Kim .................. H10K 59/131 |
| | | 257/40 |
| 2014/0354142 A1 * | 12/2014 | Jeong ................ H10K 59/122 |
| | | 313/506 |

(Continued)

FOREIGN PATENT DOCUMENTS

| KR | 20160017327 | 2/2016 |
| KR | 102098745 | 5/2020 |
| KR | 20200113056 | 10/2020 |

*Primary Examiner* — Michelle Mandala
(74) *Attorney, Agent, or Firm* — KILE PARK REED & HOUTTEMAN PLLC

(57) ABSTRACT

A display device includes: a light-emitting diode including a first electrode, a second electrode arranged on the first electrode, and an intermediate layer between the first electrode and the second electrode; a bus electrode spaced apart from the first electrode of the light-emitting diode; a bank layer covering an edge of the first electrode and an edge of the bus electrode, and exposing a portion of the first electrode and a portion of the bus electrode; and an insulating pattern layer arranged on the bus electrode, and including a first opening overlapping a first opening, wherein the second electrode contacts the bus electrode through the first opening of the insulating pattern layer.

9 Claims, 10 Drawing Sheets

(56) References Cited

U.S. PATENT DOCUMENTS

| | | |
|---|---|---|
| 2020/0303469 A1 | 9/2020 | Lee |
| 2022/0165829 A1* | 5/2022 | Yuan .................... H01L 27/1255 |
| 2022/0254845 A1* | 8/2022 | Wei ........................ H10K 71/00 |
| 2022/0278299 A1* | 9/2022 | Wang .................... H10K 59/122 |
| 2023/0189570 A1* | 6/2023 | Lin ........................ H10K 71/00 |
| | | 257/40 |

* cited by examiner

DISPLAY DEVICE

CROSS-REFERENCE TO RELATED APPLICATIONS

This application claims priority from and the benefit of Korean Patent Application No. 10-2021-0019362, filed on Feb. 10, 2021, which is hereby incorporated by reference for all purposes as if fully set forth herein.

BACKGROUND

Field

Embodiments of the invention relate generally to display devices.

Discussion of the Background

Display devices display an image by receiving information on the image. When a display device includes a display area having a relatively large area, a display quality may be deteriorated by the resistance of a wire or wires passing through the display area and/or an electrode arranged in the display area.

The above information disclosed in this Background section is only for understanding of the background of the inventive concepts, and, therefore, it may contain information that does not constitute prior art.

SUMMARY

Devices constructed according to illustrative implementations of the invention are capable of providing a display device capable of displaying a high-quality image that does not have degraded electrical characteristics by using an insulating pattern to limit a deviation in size of a contact area between an auxiliary line (i.e., a bus electrode) and an electrode (i.e., a cathode contact portion or an anode contact portion) of a light emitting element of the display device. A deviation in size of a contact area that may be otherwise caused by a laser creating openings within an intermediate layer provided between an auxiliary line and an electrode is thereby minimized or eliminated.

One or more embodiments provide a high-quality display device. This object is only an example, and the scope of the present disclosure is not limited thereby.

Additional features of the inventive concepts will be set forth in the description which follows, and in part will be apparent from the description, or may be learned by practice of the inventive concepts.

According to an embodiment, a display device includes a light-emitting diode including a first electrode, a second electrode arranged on the first electrode, and an intermediate layer between the first electrode and the second electrode, a bus electrode spaced apart from the first electrode of the light-emitting diode, a bank layer covering an edge of the first electrode and an edge of the bus electrode, and exposing a portion of the first electrode and a portion of the bus electrode, and an insulating pattern layer arranged on the bus electrode, and including a first opening overlapping the bus electrode, wherein the second electrode contacts the bus electrode through the first opening of the insulating pattern layer.

The insulating pattern layer may include an inorganic insulating material.

The intermediate layer may be arranged on an upper surface of the first electrode, an upper surface of the bus electrode, and an upper surface of the bank layer, and may include a second opening overlapping the first opening, and a width of the second opening of the intermediate layer may be greater than a width of the first opening of the insulating pattern layer.

In a plan view, an edge of the first opening may be located within the second opening.

The second electrode may contact an upper surface of the intermediate layer, an upper surface of a portion of the insulating pattern layer surrounding an edge of the first opening, and the upper surface of the bus electrode.

The intermediate layer may include an emission layer and at least one functional layer, and the second opening may penetrate through the emission layer and the at least one functional layer.

The bank layer may include a bank opening corresponding to the bus electrode, and a width of the bank opening may be greater than a width of the first opening.

The first electrode and the bus electrode may be located on a same layer and may include a same material.

The display device may further include a common voltage line electrically connected to the bus electrode, and the common voltage line may be electrically connected to at least one auxiliary pattern that overlaps the common voltage line, and may be arranged on a different layer from the common voltage line.

The display device may further include an auxiliary line extending in a direction crossing the common voltage line.

According to another embodiment, a display device includes a common voltage line, a bus electrode electrically connected to the common voltage line, a first electrode electrically insulated from the bus electrode, a bank layer exposing a portion of the first electrode and a portion of the bus electrode, and covering an edge of the first electrode and an edge of the bus electrode, an insulating pattern layer arranged on the bus electrode, wherein the insulating pattern layer includes a first opening overlapping the bus electrode and includes an inorganic material, an intermediate layer arranged on the first electrode, the bus electrode, and the bank layer, wherein the intermediate layer includes a second opening overlapping the first opening, and a second electrode arranged on the intermediate layer and corresponding to the first electrode and the bus electrode, wherein the second electrode contacts the bus electrode through the second opening and the first opening.

A width of the first opening may be less than a width of the second opening.

The bank layer may include a bank opening corresponding to the bus electrode, and a width of the bank opening may be greater than each of the width of the first opening and the width of the second opening.

The second electrode may contact an upper surface of the intermediate layer, an upper surface of a portion of the insulating pattern layer surrounding an edge of the first opening, and an upper surface of the bus electrode.

The entire first opening may overlap the second opening.

The bus electrode and the first electrode may be arranged on a same layer and may include a same material.

The common voltage line may be electrically connected to at least one auxiliary pattern that overlaps the common voltage line, and may be arranged on a different layer from the common voltage line.

The display device may further include at least one auxiliary line extending in a direction crossing the common voltage line.

The display device may further include an adjacent common voltage line being adjacent to the common voltage line, and the at least one auxiliary line may extend in the direction crossing the common voltage, and may be electrically connected to the common voltage line and the adjacent common voltage line and form a mesh structure in a plan view.

An outer edge of the insulating pattern layer may be covered with the bank layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1A:
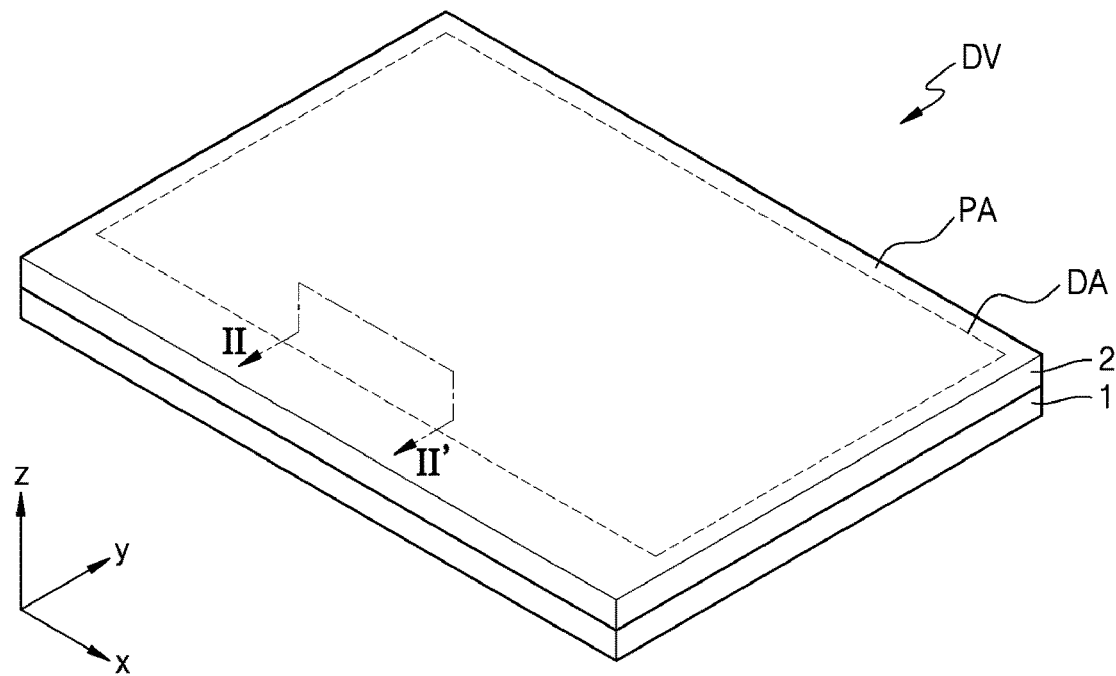
FIG. 1A is a plan view schematically illustrating a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another (i.e., are substantially perpendicular to one another). For the purposes of this disclosure, "at least one of A, B, and C" and "at least one selected from the group consisting of A, B, and C" may be construed as A only, B only, C only, or any combination of two or more of A, B, and C, such as, for instance, ABC, ABB, BC, and CC. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Figure 1B:
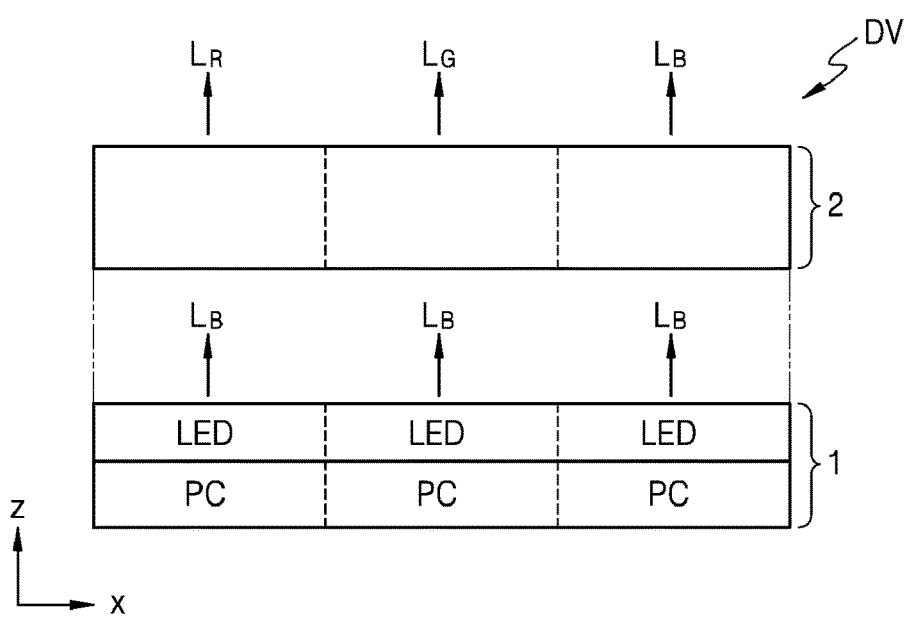
FIG. 1B is a cross-sectional view schematically illustrating a display device according to an embodiment.

FIG. 1A is a plan view schematically illustrating a display device DV according to an embodiment, and FIG. 1B is a cross-sectional view schematically illustrating a display device DV according to an embodiment.

Referring to FIG. 1A, the display device DV may include a display area DA in which a plurality of pixels are arranged, and a peripheral area PA outside the display area DA. The peripheral area PA is a non-display area in which no pixels are arranged, and may surround the display area DA entirely.

The display device DV may include a light-emitting panel 1 and a filter panel 2 that are stacked as shown in FIGS. 1A and 1B. The light-emitting panel 1 may include a plurality of light-emitting diodes LED, and each of the light-emitting diodes LED is electrically connected to a circuit PC (hereinafter referred to as a pixel circuit PC). The light-emitting diodes LED and the pixel circuits PC may be arranged in the display area DA.

In the display area DA, an image may be provided by using light from the light-emitting diodes LED. In an embodiment, when passing through the filter panel 2, blue light LB emitted from the light-emitting diodes LED may be changed to red light LR and green light LG, or may pass through the filter panel 2 without color change. The display device DV may provide an image by using the red light LR, the green light LG, and the blue light LB.

Figure 2:
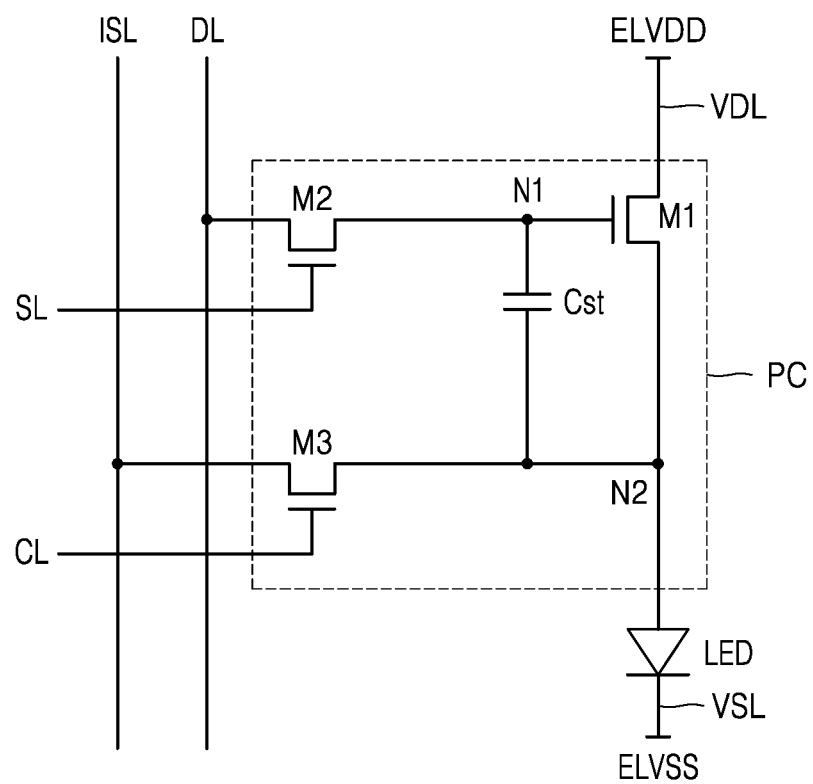
FIG. 2 is an equivalent circuit diagram illustrating a light-emitting diode provided in a light-emitting panel and a pixel circuit connected to the light-emitting diode, according to an embodiment.

FIG. 2 is an equivalent circuit diagram illustrating a light-emitting diode LED included in a light-emitting panel of a display device and a pixel circuit PC electrically connected to the light-emitting diode LED, according to an embodiment of the present disclosure.

Referring to FIG. 2, the light-emitting diode LED may be electrically connected to the pixel circuit PC including a plurality of transistors and a capacitor.

The pixel circuit PC may include a first transistor M1, a second transistor M2, a third transistor M3, and a storage capacitor Cst.

Each of the first transistor M1, the second transistor M2, and the third transistor M3 may be an oxide semiconductor thin-film transistor including a semiconductor layer formed of an oxide semiconductor, or may be a silicon semiconductor thin-film transistor including a semiconductor layer formed of polysilicon. A first electrode may be one of a source electrode and a drain electrode, and a second electrode may be the other one of the source electrode and the drain electrode, according to a type of a transistor.

The first transistor M1 may be a driving transistor. A first electrode of the first transistor M1 may be electrically connected to a driving voltage line VDL configured to apply a driving power voltage ELVDD, and a second electrode of the first transistor M1 may be electrically connected to a first electrode (for example, an anode) of the light-emitting diode LED. A second electrode (e.g., a cathode) of the light-emitting diode LED may be electrically connected to a common voltage line VSL.

A gate electrode of the first transistor M1 may be electrically connected to a first node N1. The first transistor M1 may control an amount of current flowing in the light-emitting diode LED from the driving power voltage ELVDD in correspondence with a voltage of the first node N1.

The second transistor M2 may be a switching transistor. A first electrode of the second transistor M2 may be connected to a data line DL, and a second electrode of the second transistor M2 may be connected to the first node N1. A gate electrode of the second transistor M2 may be electrically connected to a scan line SL. The second transistor M2 may be turned on when a scan signal is transmitted to the scan line SL, to electrically connect the data line DL to the first node N1.

A third transistor M3 may be an initialization transistor and/or a sensing transistor. A first electrode of the third transistor M3 may be electrically connected to a second node N2, and a second electrode of the third transistor M3 may be electrically connected to an initialization sensing line ISL. A gate electrode of the third transistor M3 may be electrically connected to a control line CL.

The third transistor M3 may be turned on when a control signal is received via the control line CL, to electrically connect the initialization sensing line ISL to the second node N2. In some embodiments, the third transistor M3 may be turned on according to a signal received via the control line CL, to initialize the first electrode of the light-emitting diode LED by using an initialization voltage from the initialization sensing line ISL. In some embodiments, the third transistor M3 may be turned on when a control signal is received via the control line CL, to sense characteristics information of the light-emitting diode LED. The third transistor M3 may have both a function of the initialization transistor described above and a function of the sensing transistor, or may have either one. In some embodiments, when the third transistor M3 has a function of the initialization transistor, the initialization sensing line ISL may be referred to as an initialization voltage line, and when the third transistor M3 has a function of the sensing transistor, the initialization sensing line ISL may be referred to as a sensing line. An initialization operation and a sensing operation of the third transistor M3 may be performed individually or simultaneously. In other words, the third transistor M3 may be an initialization transistor and/or a sensing transistor.

The storage capacitor Cst may be electrically connected between the first node N1 and the second node N2. For example, a first electrode of the storage capacitor Cst may be electrically connected to the gate electrode of the first transistor M1, and a second of the storage capacitor Cst may be electrically connected to the first electrode of the light-emitting diode LED.

In FIG. 2, the pixel circuit PC includes three transistors and one storage capacitor, but in another embodiment, the number of transistors and the number of storage capacitors may be variously modified according to the design of the pixel circuit PC.

The light-emitting diode LED may include an organic light-emitting diode including an organic material. In another embodiment, the light-emitting diode LED may include an inorganic light-emitting diode including an inorganic material. The inorganic light-emitting diode may include a p-n diode including inorganic semiconductor-based materials. When a voltage is applied to a p-n junction, a hole and an electron are injected, and an energy generated by recombination of the hole and the electron may be transformed to light energy, thereby emitting light of a color. The inorganic light-emitting diode described above may have a width of several to several hundred micrometers or several to several hundred nanometers.

Figure 3:
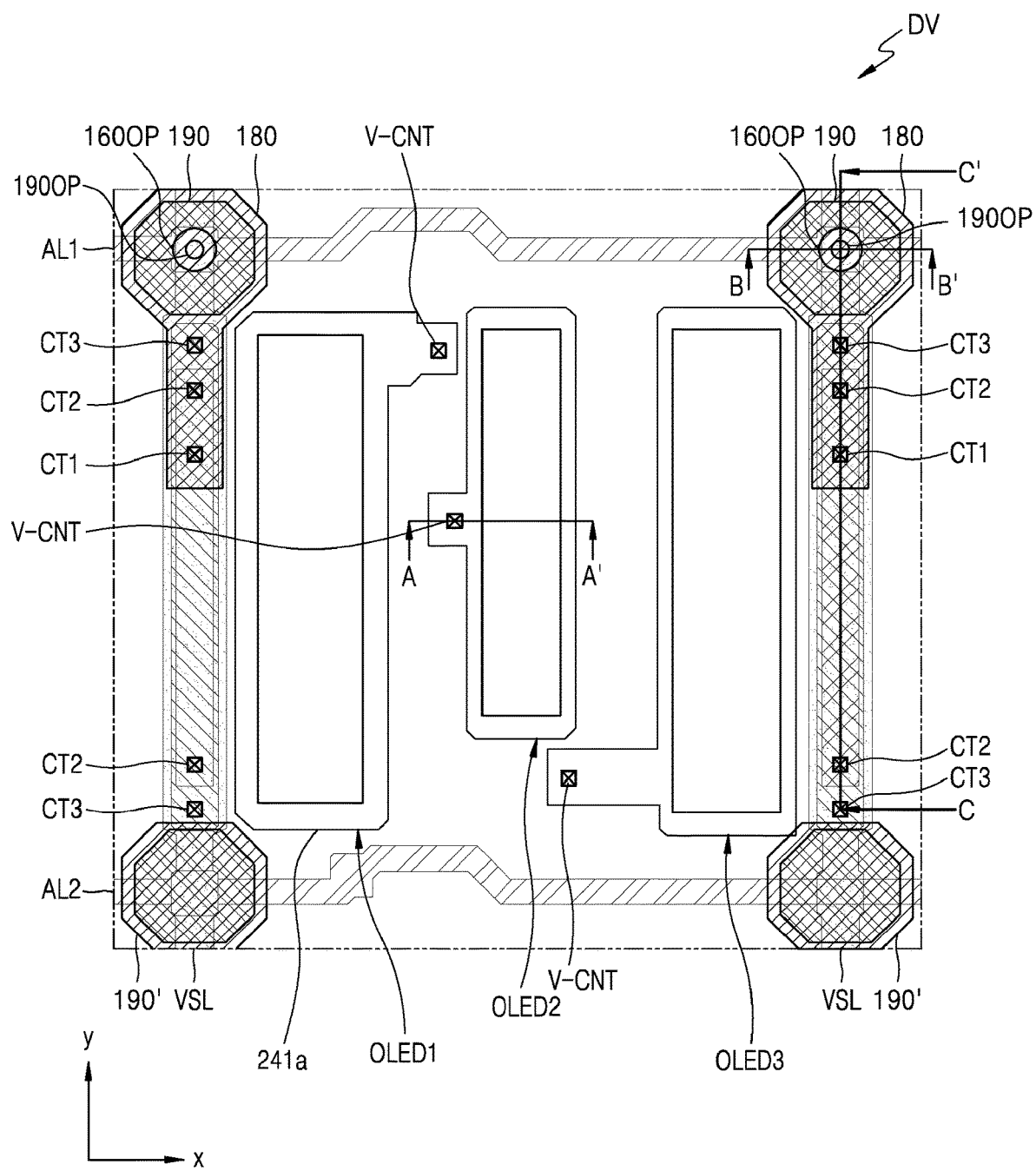
FIG. 3 is a plan view illustrating a portion of a light-emitting panel of a display device according to an embodiment.

FIG. 3 is a plan view illustrating a portion of a light-emitting panel of a display device DV according to an embodiment.

Referring to FIG. 3, the light-emitting panel includes common voltage lines VSL in the display area DA, and each of the common voltage lines VSL may extend in a y direction. The common voltage lines VSL are spaced apart from each other, but light-emitting diodes, for example, organic light-emitting diodes, may be arranged between two adjacent common voltage lines VSL. In an embodiment, FIG. 3 shows that first to third organic light-emitting diodes OLED1, OLED2, and OLED3 are arranged between two adjacent common voltage lines VSL.

Auxiliary lines extending in a direction (e.g., an x direction) crossing the common voltage lines VSL may be arranged in the display area DA. In an embodiment, FIG. 3 shows that first and second auxiliary lines AL1 and AL2 extend in the x direction, wherein the first and second auxiliary lines AL1 and AL2 may be spaced apart from each other with the first to third organic light-emitting diodes OLED1, OLED2, and OLED3 therebetween.

The common voltage line VSL may be electrically connected to at least any one of the first and second auxiliary lines AL1 and AL2. In an embodiment, as shown in FIG. 3, the common voltage line VSL may be electrically connected to the first auxiliary line AL1. FIG. 3 shows a structure of a portion of the display area DA, and the display area DA may be seen as a repeated arrangement of the structure of FIG. 3. For example, in the display area DA, a plurality of common voltage lines VSL and a plurality of first auxiliary lines AL1 are electrically connected to each other while crossing each other, and in a plan view, the common voltage lines VSL and the first auxiliary lines AL1 may form a mesh structure. When the display area DA has a relatively large area, a voltage drop of a common voltage provided through the common voltage line VSL may be caused, but the common voltage lines VSL and the first auxiliary lines AL1 may form a mesh structure to thereby prevent or minimize the voltage drop described above. In FIG. 3, the common voltage line VSL is electrically connected to the first auxiliary line AL1, but in another embodiment, the common voltage line VSL may be connected to the second auxiliary line AL2, or may be connected to each of the first and second auxiliary lines AL1 and AL2.

The common voltage line VSL may be electrically connected to auxiliary patterns overlapping the common voltage line VSL. In an embodiment, FIG. 3 shows that first and second auxiliary patterns VSC1 and VSC2 are arranged below the common voltage line VSL. The first auxiliary pattern VSC1 may be electrically connected to the common voltage line VSL through a second contact hole CT2, and the second auxiliary pattern VSC2 may be electrically connected to the common voltage line VSL through a third contact hole CT3. The first and second auxiliary patterns VSC1 and VSC2 extends in the y direction to overlap a portion of the common voltage line VSL, and may be located between the first and second auxiliary lines AL1 and AL2. The first and second auxiliary patterns VSC1 and VSC2 are electrically connected to the common voltage line VSL through the second and third contact holes CT2 and CT3, thereby reducing resistance of the common voltage line VSL itself.

A bus electrode 180 may be arranged to overlap at least a portion of the common voltage line VSL. The bus electrode 180 may be electrically connected to the common voltage line VSL through the first contact hole CT1, and a second electrode of a light-emitting diode, for example, the first to third organic light-emitting diodes OLED1, OLED2, and OLED3 may be electrically connected to the bus electrode 180 through a first opening 190OP of an insulating pattern layer 190 arranged on the bus electrode 180 and a second opening 160OP of an intermediate layer 160.

Figure 4:
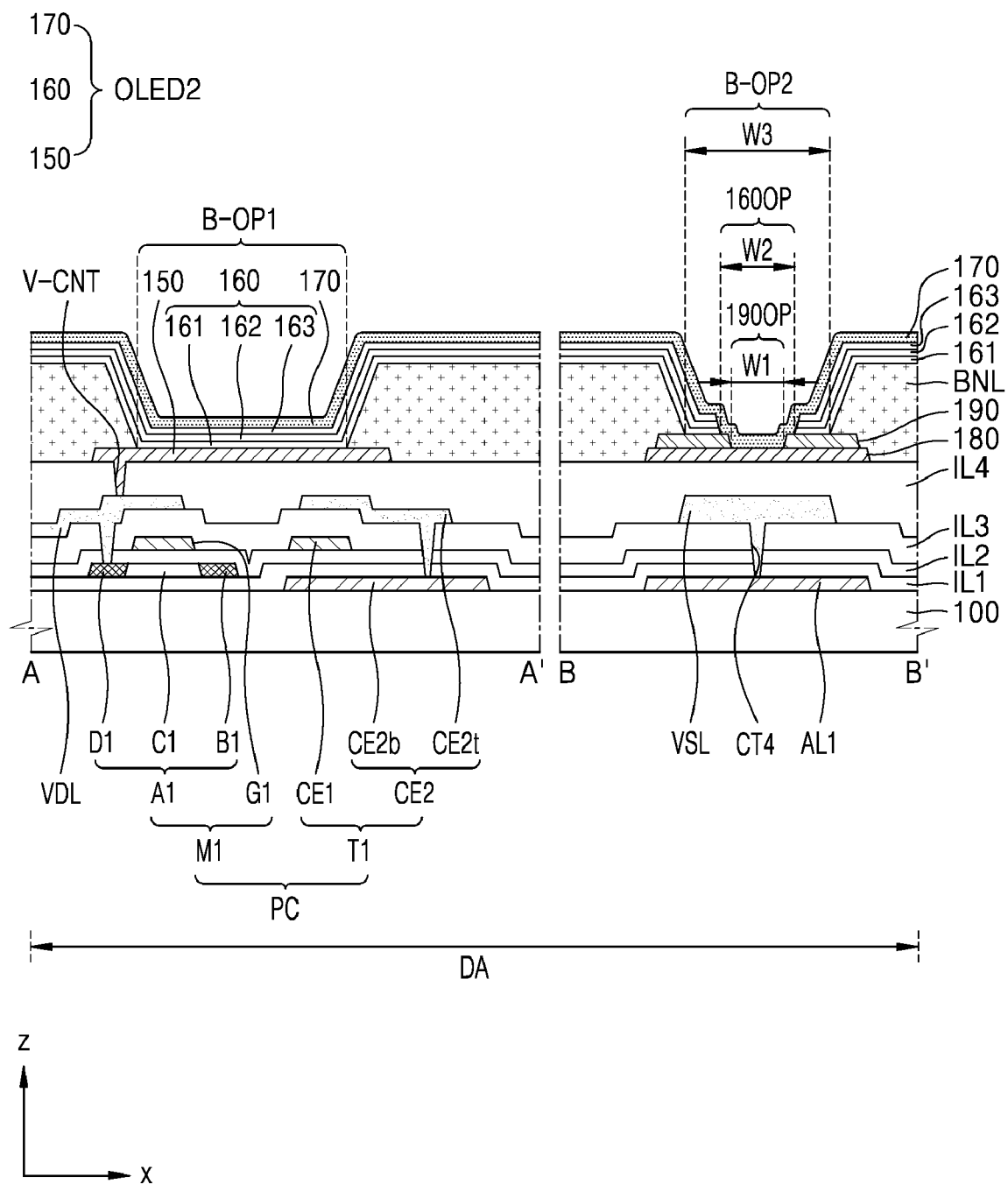
FIG. 4 shows a cross-sectional view of the display device in FIG. 3, taken along lines A-A' and B-B'.

FIG. 4 shows a cross-sectional view of the display device in FIG. 3, taken along lines A-A' and B-B'.

Referring to a cross-section taken along line A-A' of FIG. 4, a light-emitting diode, for example, the second organic light-emitting diode OLED2, may be disposed over a substrate 100, and the pixel circuit PC may be arranged between the substrate 100 and the second organic light-emitting diode OLED2. Regarding this, FIG. 4 shows a driving transistor M1 and a storage capacitor Cst which are included in the pixel circuit PC. In FIG. 4, the second organic light-emitting diode OLED2 and the pixel circuit PC connected thereto are shown, but a structure of the first and third organic light-emitting diodes OLED1 and OLED3 may be a same as that of the second organic light-emitting diode OLED2, and the pixel circuit PC connected to each of the first and third organic light-emitting diodes may be a same as the pixel circuit PC shown in FIG. 4.

The substrate 100 may include a material such as a glass material, a metal material, an organic material, or the like. For example, the substrate 100 may include a glass material having silicon dioxide ($SiO_2$) as a main component, or may include various materials that are flexible or bendable, such as polymer resin.

The driving transistor M1 may include a semiconductor layer A1 and a gate electrode G1. The semiconductor layer A1 may include an oxide-based material or a silicon-based material (for example, amorphous silicon and polysilicon). For example, the semiconductor layer A1 may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn).

The semiconductor layer A1 may include a channel area C1, a first low resistance area B1, and a second low resistance area D1, wherein the first and second low resistance areas B1 and D1 are arranged at opposite sides of the channel area C1. The first and second low resistance areas B1 and D1 are areas having a lower resistance than the channel area C1, wherein one of the first and second low resistance areas B1 and D1 may correspond to a source area, and the other one may correspond to a drain area.

The semiconductor layer A1 may be disposed over a first insulating layer IL1 formed on the substrate 100. The first insulating layer IL1 may prevent impurities from penetrating into the semiconductor layer A1. The first insulating layer IL1 may include an inorganic insulating material such as silicon nitride, silicon oxide, and/or silicon oxynitride.

A second insulating layer IL2 may be between the semiconductor layer A1 and the gate electrode G1. The second insulating layer IL2 may be a type of a gate insulating layer, and may include an inorganic insulating material such as silicon nitride, silicon oxide, and/or silicon oxynitride.

The gate electrode G1 may overlap the channel area C1 of the semiconductor layer A1. The gate electrode G1 may include molybdenum (Mo), copper (Cu), titanium (Ti), or the like, and may include a single-layer or multilayer structure including the above-mentioned materials.

Any one of the first and second low resistance areas B1 and D1 of the semiconductor layer A1 may be electrically connected to the driving voltage line VDL. The driving voltage line VDL may be arranged on a third insulating layer IL3 covering the gate electrode G1, and FIG. 4 shows that the driving voltage line VDL is connected to the second low resistance area D1 through a contact hole penetrating through the third insulating layer IL3 and the second insulating layer IL2. In another embodiment, the second insulating layer IL2 and the gate electrode G1 may be patterned together in a substantially same mask process, and thus, the second insulating layer IL2 may not extend onto an upper surface of the first and second low resistance areas B1 and D1. In this case, the driving voltage line VDL may be connected to the second low resistance area D1 through the contact hole penetrating through the third insulating layer IL3.

The driving voltage line VDL may include a metal material such as Mo, Cu, Ti, or the like. In another embodiment, the driving voltage line VDL may include a multilayer structure of the metal material layer described above and a transparent conductive oxide layer such as an indium tin oxide (ITO) layer disposed on the metal material layer.

The storage capacitor Cst includes a first capacitor electrode CE1, and a second capacitor electrode CE2 overlapping the first capacitor electrode CE1 with at least one insulating layer therebetween. The first capacitor electrode CE1 and the gate electrode G1 may be formed on a same layer and may include a same material. The first capacitor electrode CE1 may include Mo, Cu, Ti, or the like, and may include a single-layer or multilayer structure including the above-mentioned materials.

In an embodiment, the second capacitor electrode CE2 may include two sub-capacitor electrodes CE2b and CE2t arranged below and over the first capacitor electrode CE1 with the first capacitor electrode CE1 therebetween. Any one sub-capacitor electrode (hereinafter referred to as a first sub-capacitor electrode CE2b) of the sub-capacitor electrodes CE2b and CE2t may be arranged between the substrate 100 and the first insulating layer IL1, and the other sub-capacitor electrode (hereinafter referred to as a second sub-capacitor electrode CE2t) may be arranged on the third insulating layer IL3.

The first sub-capacitor electrode CE2b and the second sub-capacitor electrode CE2t include Mo, Cu, Ti, or the like, and may include a single-layer or multilayer including the above-mentioned materials. In an embodiment, the second sub-capacitor electrode CE2t and the driving voltage line VDL may be arranged on a same layer and may include a same material.

The second sub-capacitor electrode CE2t may be connected to the first sub-capacitor electrode CE2b through a contact hole penetrating through the first to third insulating layers IL1, IL2, and IL3. A capacitance may be formed between the first sub-capacitor electrode CE2b and the first capacitor electrode CE1 which overlap each other with the first and second insulating layers IL1 and IL2 therebetween, and a capacitance may be formed between the first capacitor electrode CE1 and the second sub-capacitor electrode CE2t which overlap each other with the third insulating layer IL3 therebetween. As described above, the second capacitor electrode CE2 includes a plurality of sub-capacitors, thereby improving a capacitance stored in the storage capacitor Cst.

In FIG. 4, the first and second insulating layers IL1 and IL2 are between the first sub-capacitor electrode CE2b and the first capacitor electrode CE1, but in another embodiment, the second insulating layer IL2 and the first capacitor electrode CE1 may be patterned together in a mask process for forming the first capacitor electrode CE1. In this case, the first insulating layer IL1 may be between the first sub-capacitor electrode CE2b and the first capacitor electrode CE1, and the second sub-capacitor electrode CE2t may be connected to the first sub-capacitor electrode CE2b through a contact hole penetrating through the first and third insulating layers IL1 and IL3.

A fourth insulating layer IL4 may be arranged on the pixel circuit PC including the driving transistor M1 and the storage capacitor Cst described above. The fourth insulating layer IL4 may include an organic insulating layer such as acryl, benzocyclobutene (BCB), polyimide, hexamethyldisiloxane (HMDSO), or the like.

A first electrode 150 of a light-emitting diode may be formed on the fourth insulating layer IL4, and FIG. 4 shows the first electrode 150 of the second organic light-emitting diode OLED2.

The first electrode 150 may include a transparent conductive oxide such as ITO, indium zinc oxide (IZO), zinc oxide (ZnO), indium oxide ($In_2O_3$), indium gallium oxide (IGO), and/or aluminum zinc oxide (AZO). In another embodiment, the first electrode 150 may include a reflective film including silver (Ag), magnesium (Mg), aluminum (Al), platinum (Pt), palladium (Pd), gold (Au), nickel (Ni), neodymium (Nd), iridium (Ir), Cr, or any compounds thereof. In another embodiment, the first electrode 150 may further include a film formed of ITO, IZO, ZnO, or $In_2O_3$ below or over the above-mentioned reflective film. For example, the first electrode 150 may have a three-layer structure in which an ITO layer, an Ag layer, and another ITO layer are stacked.

A bank layer BNL covers an edge of the first electrode 150, and may include a first bank opening B-OP1 overlapping a central portion of the first electrode 150. The bank layer BNL may include an organic insulating material such as polyimide.

The intermediate layer 160 may contact the first bank opening B-OP1 through the first bank opening B-OP1 of the bank layer BNL, and the first electrode 150, the intermediate layer 160, and a second electrode 170 may be electrically connected to one another through the first bank opening B-OP1, thereby emitting light of a color. The first bank opening B-OP1 of the bank layer BNL may correspond to a light-emitting area EA for emitting light. For example, a size (or width) of the first bank opening B-OP1 of the bank layer BNL may correspond to a size (or width) of the light-emitting area EA.

The intermediate layer 160 may include an emission layer 162. The emission layer 162 may include a polymer or low-molecular weight organic material emitting light of a color. For example, as described with reference to FIG. 1B, when the light-emitting panel 1 emits blue light, the emission layer 162 may include a polymer or low-molecular organic material emitting blue light.

The intermediate layer 160 may further include at least one functional layer. In an embodiment, as shown in FIG. 4, the intermediate layer 160 may further include a first functional layer 161 below the emission layer 162, and a second functional layer 163 over the emission layer 162. The first functional layer 161 may be between the first electrode 150 and the emission layer 162, and the second functional layer 163 may be between the emission layer 162 and the second electrode 170 to be described later.

The first functional layer 161 may include a hole transport layer (HTL) and/or a hole injection layer (HIL). The second functional layer 163 may include an electron transport layer (ETL) and/or an electron injection layer (EIL).

The second electrode 170 may include a conductive material having a low work function. For example, the second electrode 170 may include (semi)transparent layer including Ag, Mg, Al, Pt, Pd, Au, Ni, Nd, Ir, Cr, Li, Ca, or any alloys thereof. In some embodiments, the second electrode 170 may further include a layer such as an ITO layer, an IZO layer, a ZnO layer, or an $In_2O_3$ layer, over the (semi)transparent layer including the materials described above.

Referring to a cross-section taken along line B-B' in FIG. 4, the first auxiliary line AL1 may be arranged on the substrate 100. Likewise, the second auxiliary line AL2 described with reference to FIG. 3 may also be arranged on the substrate 100.

The common voltage line VSL and the driving voltage line VDL may be formed on a same layer and may include a same material. For example, the common voltage line VSL may be formed on the third insulating layer IL3. As described above with reference to FIG. 3, the common voltage line VSL may be electrically connected to at least any one of the first and second auxiliary lines AL1 and AL2, and regarding this, FIG. 4 shows that the common voltage line VSL is electrically connected to the first auxiliary line AL1 through a fourth contact hole CT4 which penetrates through the first to third insulating layers IL1, IL2, and IL3. In another embodiment, when the second insulating layer IL2 is patterned in a same mask to have a same pattern as the gate electrode G1 and the first capacitor electrode CE1, the fourth contact hole CT4 may penetrate through the first and third insulating layers IL1 and IL3, and the common voltage line VSL may be electrically connected to the first auxiliary line AL1 through the fourth contact hole CT4 which penetrates through the first and third insulating layers IL1 and IL3.

Referring to FIGS. 3 and 4, the bus electrode 180 may overlap the common voltage line VSL with the fourth insulating layer IL4 therebetween. The bus electrode 180 and the first electrode 150 of the light-emitting diode may be formed on a same layer (for example, the fourth insulating layer IL4), and may include a same material.

The insulating pattern layer 190 may be arranged on the bus electrode 180. For example, the insulating pattern layer 190 may come into direct contact with an upper surface of the bus electrode 180. The insulating pattern layer 190 may include an inorganic material, for example, an inorganic insulating material such as silicon nitride, silicon oxide, and silicon oxynitride. A thickness of the insulating pattern layer 190 may be about 0.3 µm to about 3 µm. The insulating pattern layer 190 may include the first opening 190OP.

An edge of the bus electrode 180 may be covered with the bank layer BNL. An edge of the insulating pattern layer 190 may also be covered with the bank layer BNL. The bank layer BNL may include a second bank opening B-OP2 that overlaps the bus electrode 180 and the insulating pattern layer 190. The second bank opening B-OP2 may overlap the first opening 190OP of the insulating pattern layer 190, and a width W3 of the second bank opening B-OP2 may be greater than a width W1 of the first opening 190OP of the insulating pattern layer 190.

The intermediate layer 160 may extend onto the insulating pattern layer 190. The intermediate layer 160 may be arranged over an upper surface of the first electrode 150, an upper surface of the bank layer BNL, and an upper surface of the insulating pattern layer 190, and may come into direct contact with each of them. The intermediate layer 160 may include the second opening 160OP overlapping the first opening 190OP of the insulating pattern layer 190, and the second electrode 170 may contact the bus electrode 180 through the first opening 190OP and the second opening 160OP. Because the bus electrode 180 may be electrically connected to the first contact hole CT1 as described above with reference to FIG. 3, the second electrode 170 may be electrically connected to the common voltage line VSL through the bus electrode 180.

A width W2 of the second opening 160OP may be greater than the width W1 of the first opening 190OP. In other words, the width W1 of the first opening 190OP may be less than the width W2 of the second opening 160OP. For example, the width W1 of the first opening 190OP may be about 5 µm to about 18 µm, or about 5 µm to about 15 µm, or about 5 µm to about 10 µm.

The second opening 160OP of the intermediate layer 160 may be formed by irradiating a laser beam to the intermediate layer 160 and removing a portion of the intermediate layer 160. A plurality of second openings 160OP are formed in the display area DA, and even when a same laser beam is used to form each of the second openings 160OP, it is difficult to form all the widths of the second opening 160OP equally due to a process error.

However, according to an embodiment, the insulating pattern layer 190 having the first opening 190OP which is smaller in size than a beam size of the laser beam is between the second electrode 170 and the bus electrode 180, and thus, a contact area between the second electrode 170 and the bus electrode 180 may be defined by the first opening 190OP of the insulating pattern layer 190. Thus, even when a deviation in width of the second openings 160OP formed by the laser beam is caused, the width deviation of the second openings 160OP does not affect the contact area between the second electrode 170 and the bus electrode 180.

In a comparative example, when the insulating pattern layer 190 is not present, the contact area between the second electrode 170 and the bus electrode 180 may be defined by the second opening 160OP of the intermediate layer 160. The greater the deviation in width of the second openings 160OP formed by the laser beam, the greater the deviation of the contact area between the second electrode 170 of the light-emitting diode and the bus electrode 180, and thus, there is a problem in that a display quality of the display device is deteriorated. However, according to embodiments described herein, the insulating pattern layer 190 having the first opening 190OP is arranged between the second electrode 170 and the bus electrode 180, thereby preventing or minimizing the problem described above.

In the display area DA, contact regions between the second electrode 170 of the light-emitting diode and the bus electrode 180 may be spaced apart from each other and arranged with a predetermined rule. Here, an area of the contact region between the second electrode 170 of the light-emitting diode and the bus electrode 180 corresponds to an area of the first opening 190OP of the insulating pattern layer 190. Because the first opening 190OP of the insulating pattern layer 190 arranged in each contact region has a relatively constant size, the areas of the contact areas between the second electrode 170 of the light-emitting diode and the bus electrode 180 may be substantially a same as each other. Thus, as described above, the above-mentioned problem of deterioration of display quality due to the deviation in contact area between the second electrode 170 of the light-emitting diode and the bus electrode 180 may be prevented or minimized.

Figure 5:
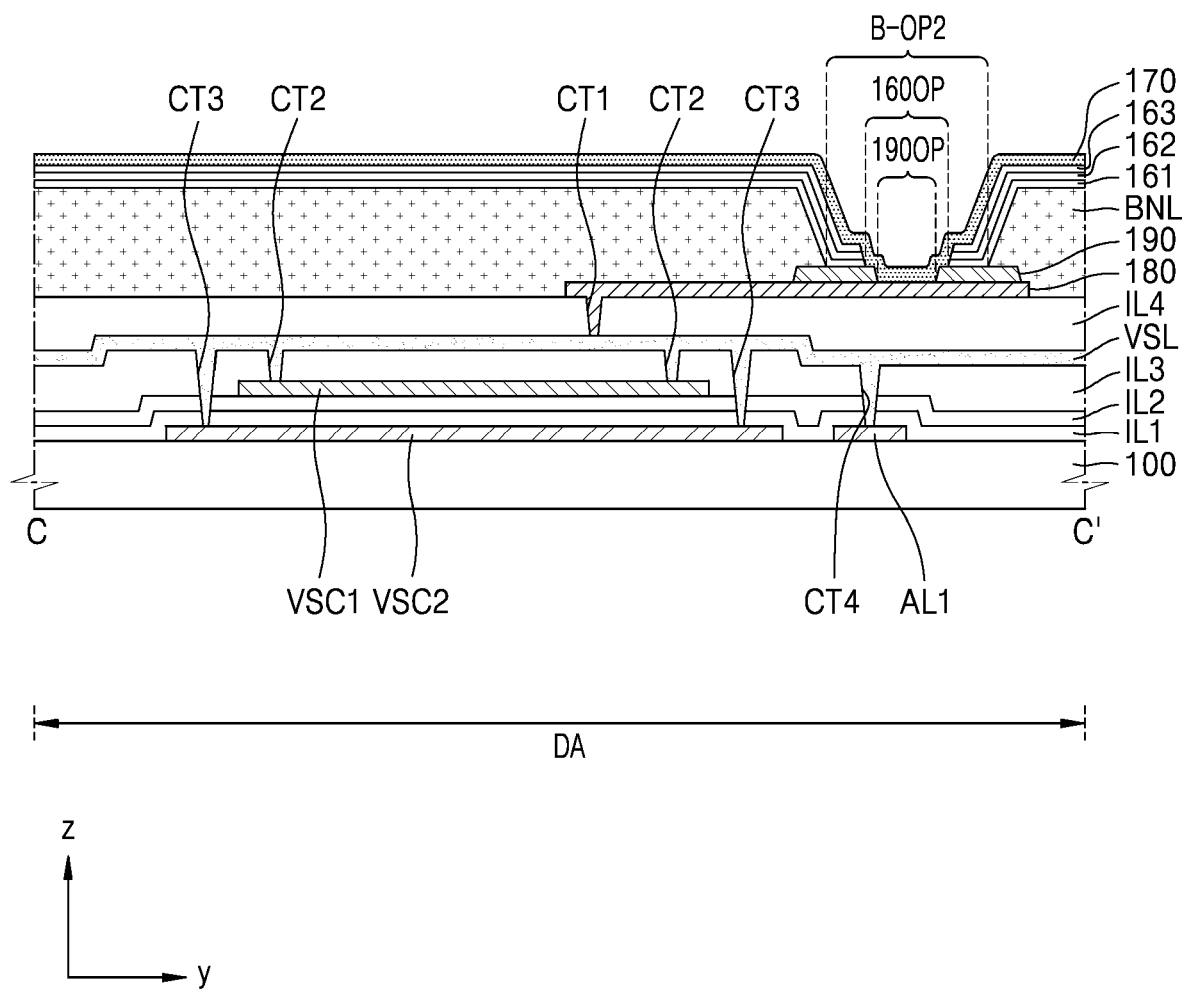
FIG. 5 is a cross-sectional view of the display device in FIG. 3, taken along line C-C'.

FIG. 5 is a cross-sectional view of the display device in FIG. 3, taken along line C-C'.

Referring to FIG. 5, the bus electrode 180 may be arranged on the common voltage line VSL with the fourth insulating layer IL4 therebetween. As described above with reference to the cross-section taken along line B-B' in FIG. 4, the insulating pattern layer 190 having the first opening 190OP is arranged on the bus electrode 180, and the contact area between the second electrode 170 and the bus electrode 180 is defined by the first opening 190OP.

The common voltage line VSL may be electrically connected to the first auxiliary line AL1 through the fourth contact hole CT4. The common voltage line VSL may be arranged to overlap the common voltage line VSL, and may be electrically connected to at least one auxiliary pattern arranged on a different layer from the common voltage line VSL. Regarding this, FIG. 5 shows the first and second auxiliary patterns VSC1 and VSC2.

The first auxiliary pattern VSC1 may be arranged below the third insulating layer IL3. The first auxiliary pattern VSC1 may be electrically connected to the common voltage line VSL through the second contact hole CT2 of the third insulating layer IL3. For example, the common voltage line VSL may come into contact with the first auxiliary pattern VSC1 through the second contact holes CT2 of the third insulating layer IL3.

As described above with reference to FIG. 4, the first auxiliary pattern VSC1 may be arranged on a same layer as the gate electrode G1 and/or the first capacitor electrode CE1, and may include a same material as the gate electrode G1 and/or the first capacitor electrode CE1. For example, the first auxiliary pattern VSC1 may be arranged on the second insulating layer IL2, may include Mo, Cu, Ti, or the like, and may include a single-layer or multilayer structure including the above-mentioned materials.

The second auxiliary pattern VSC2 may be electrically connected to the common voltage line VSL through the third contact holes CT3 which are formed in the first to third insulating layers IL1, IL2, and IL3 located between the second auxiliary pattern VSC2 and the common voltage line VSL. For example, the common voltage line VSL may contact the second auxiliary pattern VSC2 through the third contact holes CT3 which penetrate through the first to third insulating layers IL1, IL2, and IL3.

The second auxiliary pattern VSC2 and the first auxiliary line AL1 may be arranged on a same layer and may include a same material. In some embodiments, the second auxiliary pattern VSC2 and the first sub-capacitor electrode CE2b described above with reference to FIG. 4 may be arranged on a same layer and may include a same material. The second auxiliary pattern VSC2 may be arranged on the substrate 100, may include Mo, Cu, Ti, or the like, and may include a single-layer or multilayer structure including the above-mentioned materials.

Figure 9:
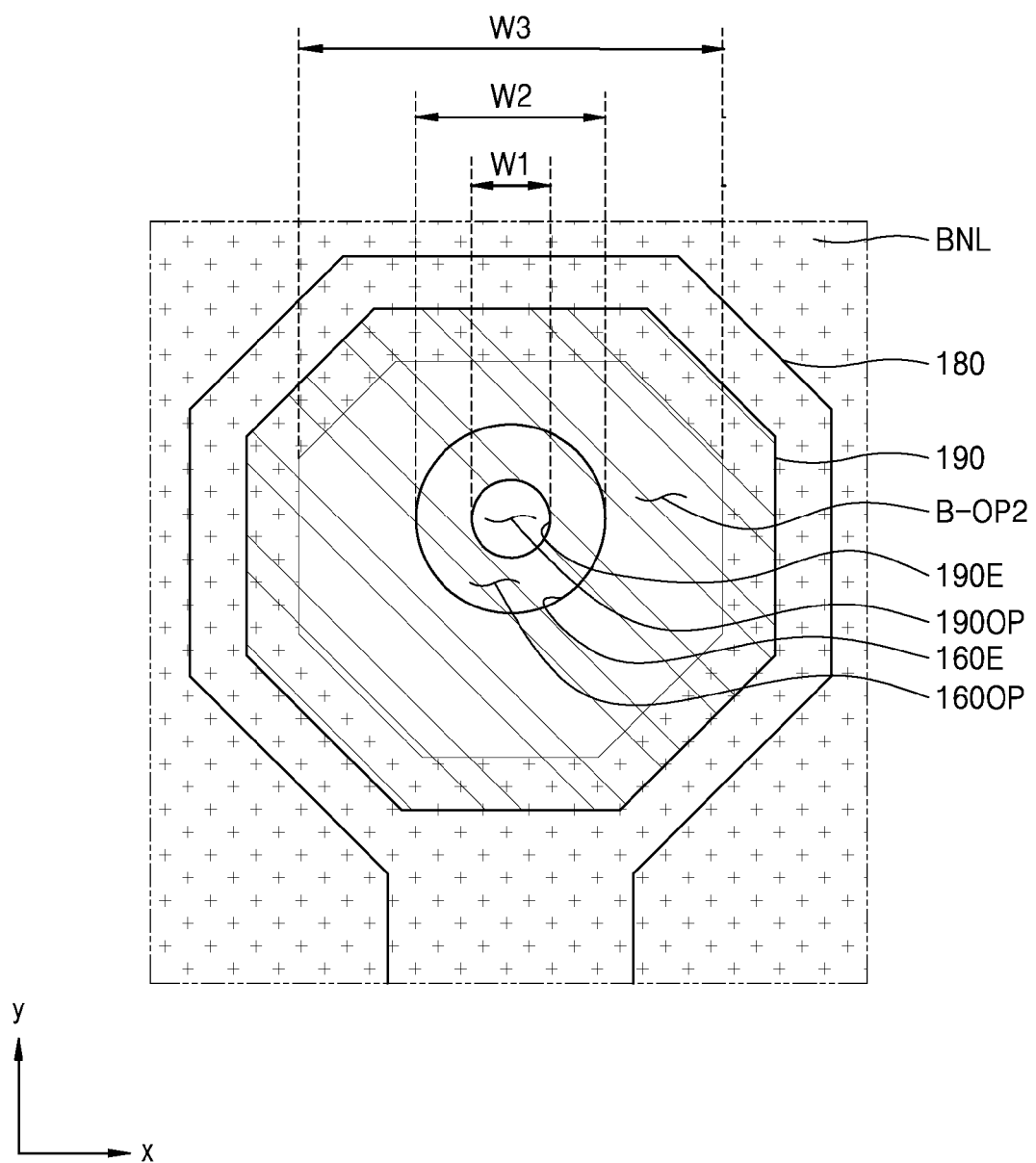
FIG. 9 is a plan view illustrating an insulating pattern layer in FIG. 8 and a peripheral area thereof.

FIGS. 6, 7, 8, and 10 are cross-sectional views schematically illustrating a process of forming a light-emitting panel of a display device, according to an embodiment, and FIG. 9 is a plan view of an insulating pattern layer and a peripheral area thereof.

Figure 6:
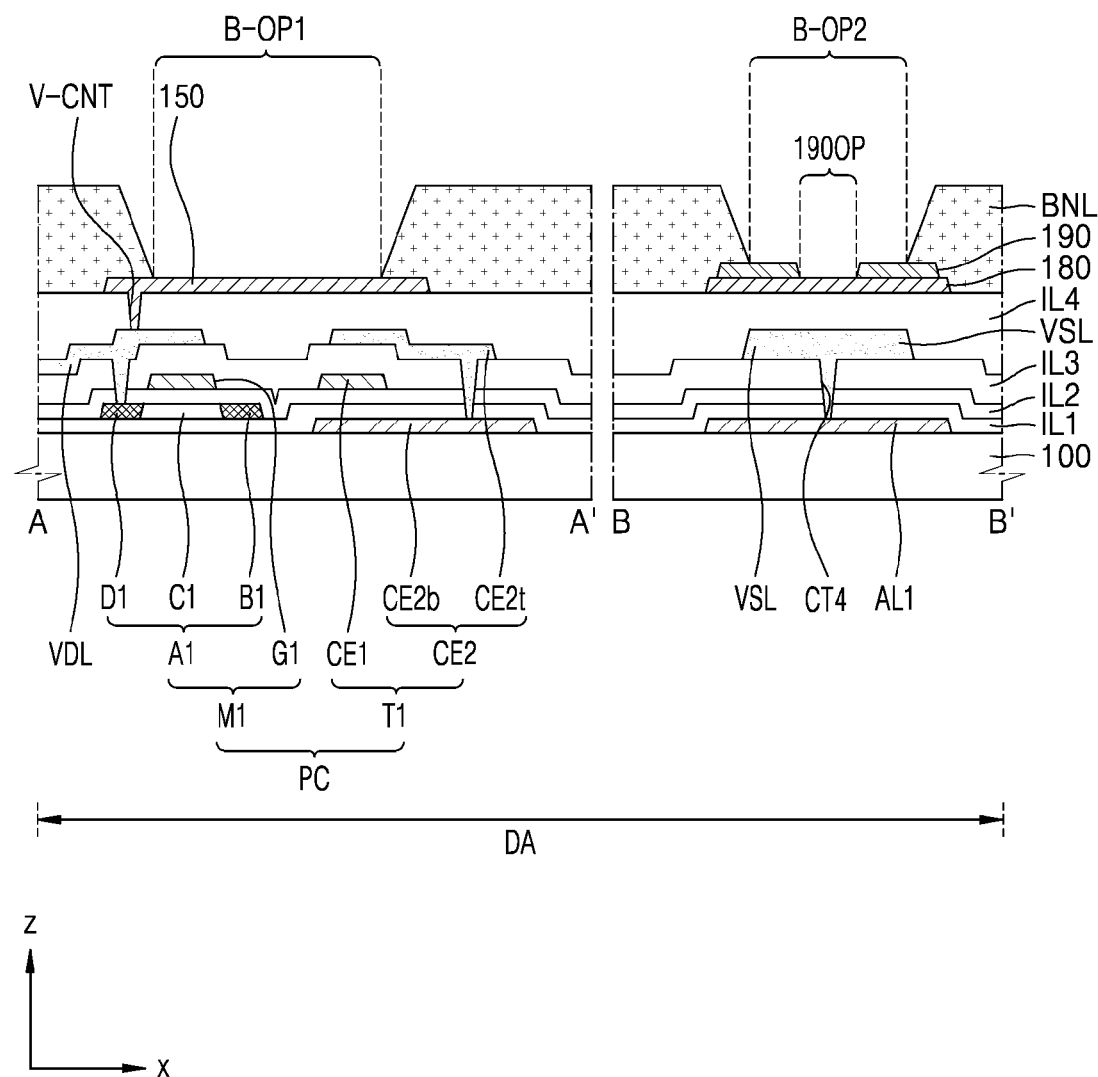
FIG. 6 is a cross-sectional view illustrating a process of forming a light-emitting panel of a display device, according to an embodiment.

Referring to FIG. 6, the first electrode 150 of the light-emitting diode and the bus electrode 180 are formed on the substrate 100. The first electrode 150 and the bus electrode 180 are electrically insulated from each other, and may be spaced apart from each other. Before the first electrode 150 and the bus electrode 180 are formed, various layers may be formed on the substrate 100. Regarding this, FIG. 6 shows the pixel circuit PC and the common voltage line VSL electrically connected to the bus electrode 180.

As shown in FIG. 6, the first auxiliary line AL1 and the first sub-capacitor electrode CE2b may be formed on the substrate 100, and the first auxiliary line AL1 may be formed. The first auxiliary line AL1 and the first sub-capacitor electrode CE2b may be formed in a same process and may include a same material. As described above, the first auxiliary line AL1 and the first sub-capacitor electrode CE2b may include Mo, Cu, and/or Ti. The second auxiliary line AL2 and the second auxiliary pattern VSC2 described above with reference to FIGS. 3 and 5 may be formed in a same process as the first auxiliary line AL1 and the first sub-capacitor electrode CE2b. Each of the second auxiliary line AL2 and the second auxiliary pattern VSC2 may include a same material as each of the first auxiliary line AL1 and the first sub-capacitor electrode CE2b.

The first insulating layer IL1 may prevent impurities from penetrating into the semiconductor layer A1, and may include an inorganic insulating material such as silicon nitride, silicon oxide, and silicon oxynitride.

The semiconductor layer A1 may be disposed over the first insulating layer IL1, the second insulating layer IL2 may be disposed over the semiconductor layer A1, and the gate electrode G1 and a first capacitor electrode CE1 may be disposed over the second insulating layer IL2. The first auxiliary pattern VSC1 described above with reference to FIG. 5, the gate electrode G1, and a first capacitor electrode CE1 may be formed in a same process and may include a same material. The first auxiliary pattern VSC1, the gate electrode G1, and the first capacitor electrode CE1 may include Mo, Cu, and/or Ti.

In FIG. 6, the second insulating layer IL2 is formed to cover most of the substrate 100, but in another embodiment, the second insulating layer IL2 may be patterned by using a same mask as layers disposed directly over the second insulating layer IL2, for example, the first auxiliary pattern VSC1, the gate electrode G1, and the first capacitor electrode CE1. In this case, a portion of the second insulating layer IL2, for example, a portion of the second insulating layer IL2 other than a portion overlapping the first auxiliary pattern VSC1, the gate electrode G1, and the first capacitor electrode CE1, may be removed.

Thereafter, the third insulating layer IL3 may be formed, and contact holes including the fourth contact hole CT4 may be formed. In addition, the driving voltage line VDL, the second sub-capacitor electrode CE2t, and the common voltage line VSL may be formed on the third insulating layer IL3. The third insulating layer IL3 may include an inorganic insulating material. The driving voltage line VDL, the second sub-capacitor electrode CE2t, and the common voltage line VSL may be formed in a same mask process and may include a same material. The driving voltage line VDL, the second sub-capacitor electrode CE2t, and the common voltage line VSL may include Mo, Cu, and/or Ti.

Thereafter, the fourth insulating layer IL4 is formed. The fourth insulating layer IL4 may include an organic insulating material, and the first electrode 150 and the bus electrode 180 may be formed on the fourth insulating layer IL4.

The first electrode 150 and the bus electrode 180 may be formed in a same process and may include a same material. The first electrode 150 and the bus electrode 180 may include a three-layer structure of an ITO layer, an Ag layer, and another ITO layer.

Then, the insulating pattern layer 190 may be formed on the bus electrode 180. The insulating pattern layer 190 may include an inorganic insulating material such as silicon nitride, silicon oxide, and silicon oxynitride. The insulating pattern layer 190 may have a thickness of about 0.3 μm to about 3 μm. The insulating pattern layer 190 may be etched to have the first opening 190OP overlapping the bus electrode 180. A portion of the bus electrode 180 may be exposed through the first opening 190OP. In FIG. 6, a width of the insulating pattern layer 190 is less than a width of the bus electrode 180, but in another embodiment, the insulating pattern layer 190 may extend onto the fourth insulating layer IL4 to cover an edge of the bus electrode 180, and an edge portion of the insulating pattern layer 190 may come into direct contact with the fourth insulating layer IL4.

Then, the bank layer BNL is formed so that a portion of the first electrode 150 and the first opening 190OP are exposed. The bank layer BNL may cover an edge of the first electrode 150 and an edge of the bus electrode 180. The bank layer BNL may cover an edge of the insulating pattern layer 190, for example, an outer edge defining a planar shape of the bus electrode 180. The bank layer BNL may include the first bank opening B-OP1 and the second bank opening B-OP2.

A portion of the first electrode 150 may be exposed through the first bank opening B-OP1. A width of the first bank opening B-OP1 is formed to be less than that of the first electrode 150, and thus, the edge of the first electrode 150 may be covered with the bank layer BNL.

The second bank opening B-OP2 of the bank layer BNL may be formed to be greater in size than the first opening 190OP. Thus, the first opening 190OP of the insulating pattern layer 190 and an upper surface of a portion of the insulating pattern layer 190 surrounding the first opening 190OP may be exposed through the second bank opening B-OP2 of the bank layer BNL. The width W3 of the second bank opening B-OP2 may be greater than the width W1 of the first opening 190OP, and may be greater than a size of the laser beam. The width W3 of the second bank opening B-OP2 may be greater than the width W2 of the second opening 160OP of the intermediate layer 160 to be described later.

Then, as shown in FIG. 7B, the intermediate layer 160 is formed. For example, the first functional layer 161, the emission layer 162, and the second functional layer 163 may be formed by using a chemical vapor deposition method.

The first functional layer 161, the emission layer 162, and the second functional layer 163 may be formed to entirely cover the display area DA.

Figure 7:
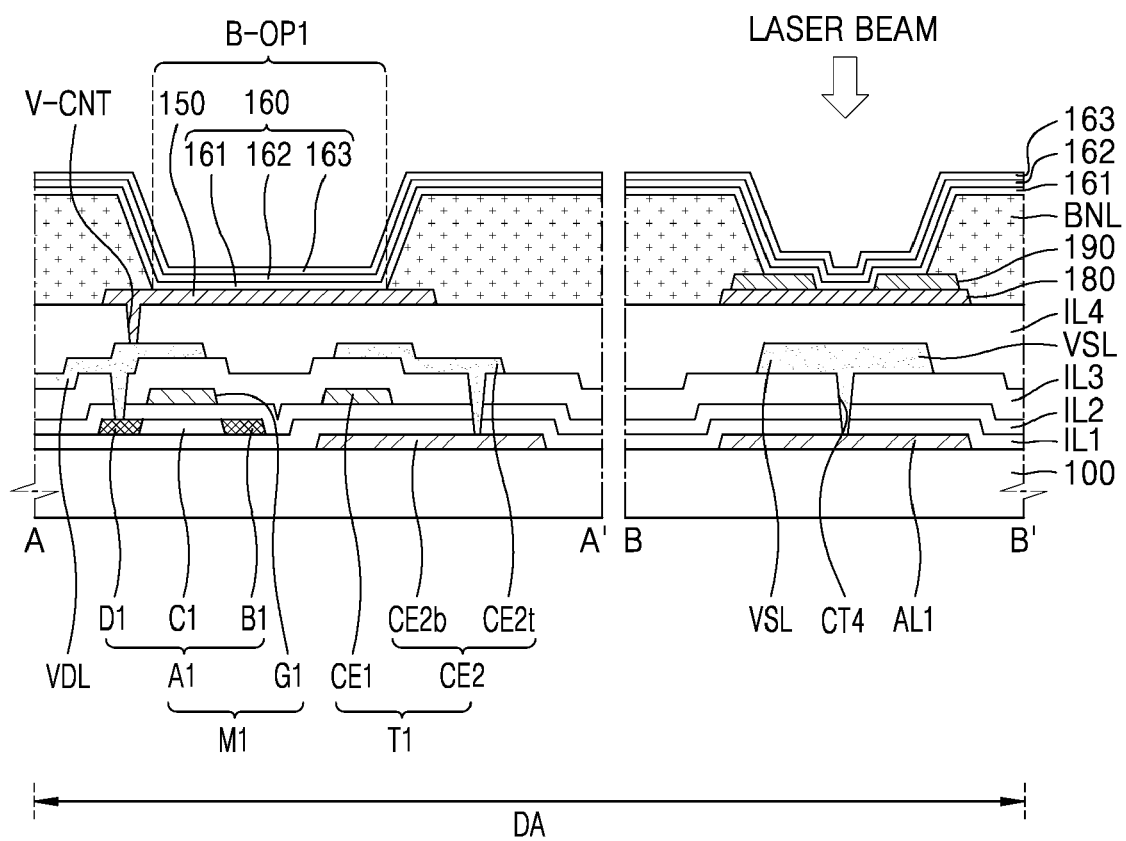
FIG. 7 is a cross-sectional view illustrating a process of forming a light-emitting panel of a display device, according to an embodiment.
Figure 8:
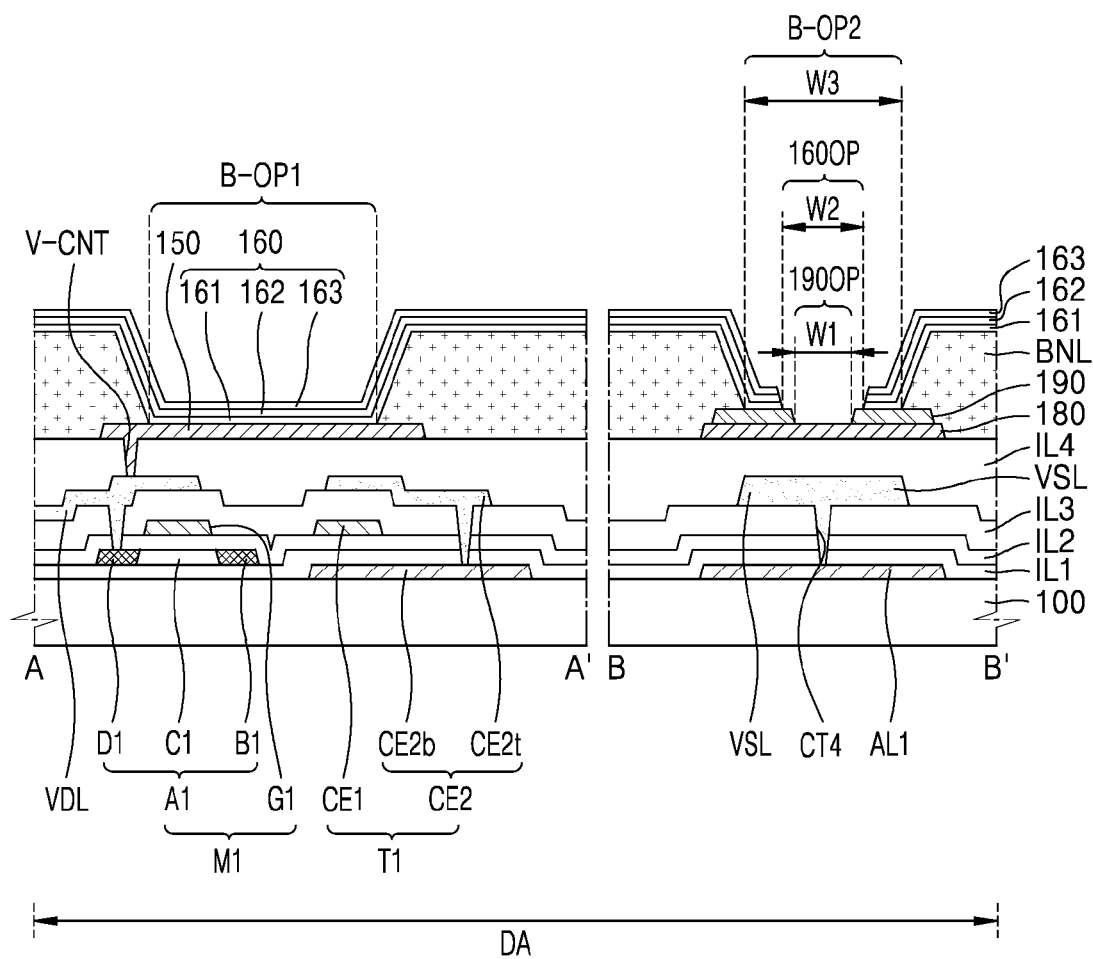
FIG. 8 is a cross-sectional view illustrating a process of forming a light-emitting panel of a display device, according to an embodiment.

Then, as shown in FIG. 7, a laser beam may be irradiated onto the intermediate layer 160, thereby forming the second opening 160OP. In an embodiment, an ultraviolet (UV) laser having a center wavelength band of about 300 nm to about 400 nm may be used as the laser beam. The second opening 160OP may be formed by removing sub-layers included in the intermediate layer 160 by the laser beam. For example, by the laser beam, an opening of the second functional layer 163, an opening of the emission layer 162, and an opening of the first functional layer 161 may be simultaneously formed. A stacked structure of the opening of the second functional layer 163, the opening of the emission layer 162, and the opening of the first functional layer 161 may form the second opening 160OP. In other words, the second opening 160OP may have a depth corresponding to a sum of thicknesses of the second functional layer 163, the emission layer 162, and the first functional layer 161.

A size of the second opening 160OP of the intermediate layer 160 may be determined by a size of the laser beam. The second opening 160OP of the intermediate layer 160 may be formed to overlap the first opening 190OP of the insulating pattern layer 190 which is disposed below the intermediate layer 160. The second opening 160OP of the insulating pattern layer 190 may be formed to be greater in size than the first opening 190OP of the insulating pattern layer 190, and in FIGS. 8 and 9, the width W2 of the second opening 160OP greater than the width W1 of the first opening 190OP is shown.

The second opening 160OP of the intermediate layer 160 may overlap the first opening 190OP of the insulating pattern layer 190 disposed below the intermediate layer 160, but, in a plan view, the first opening 190OP of the insulating pattern layer 190 may be formed to be located in the second opening 160OP of the intermediate layer 160. In other words, except for a portion of the first opening 190OP of the insulating pattern layer 190, the first opening 190OP of the insulating pattern layer 190 may entirely overlap the second opening 160OP of the intermediate layer 160.

As shown in FIG. 9, in a plan view (or when viewed from a direction perpendicular to the substrate 100), an edge 190E of the first opening 190OP of the insulating pattern layer 190 may be arranged in the second opening 160OP. In other words, in a plan view, the edge 190E of the first opening 190OP may be arranged inside an edge 160E of the second opening 160OP.

Because the first opening 190OP is formed by etching a portion of the insulating pattern layer 190 and the second opening 160OP is formed by etching a portion of the intermediate layer 160, the edge 190E of the first opening 190OP may be regarded as the edge 190E of the insulating pattern layer 190 defining the first opening 190OP, and the edge 160E of the second opening 160OP may be regarded as the edge 160E of the intermediate layer 160 defining the second opening 160OP.

Figure 10:
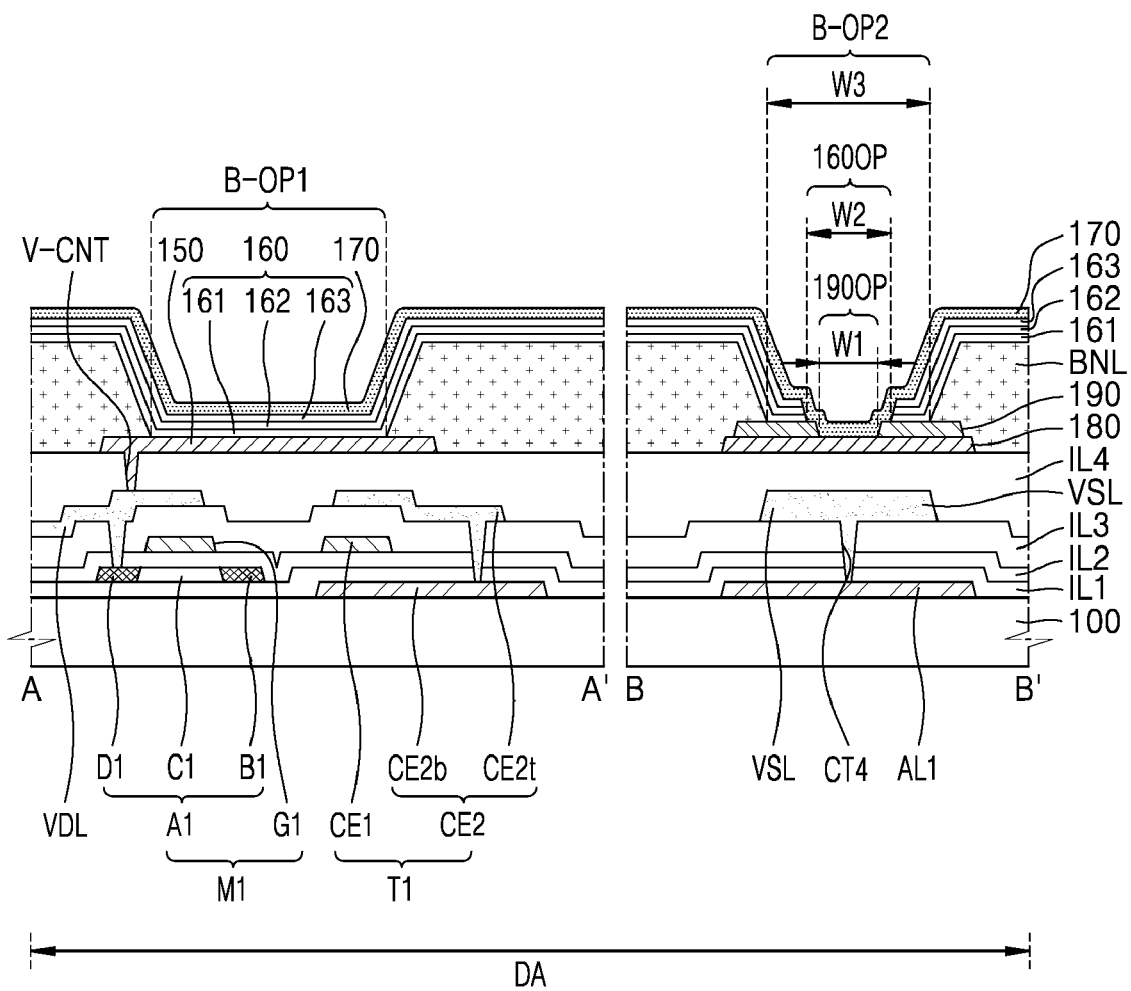
FIG. 10 is a cross-sectional view illustrating a process of forming a light-emitting panel of a display device, according to an embodiment.

Next, as shown in FIG. 10, the second electrode 170 of the light-emitting diode is formed. The second electrode 170 may be formed to entirely cover the display area DA.

The second electrode 170 may contact an upper surface of the intermediate layer 160, an upper surface of a portion of the insulating pattern layer 190 surrounding of the edge 190E, and an upper surface of the bus electrode 180.

A first portion of the second electrode 170 corresponding to the first bank opening B-OP1 may come into contact the upper surface of the intermediate layer 160. The first electrode 150, the intermediate layer 160, and the first portion of the second electrode 170 overlapping each other in the first bank opening B-OP1 may be electrically connected to each other and form the light-emitting diode.

A second portion of the second electrode 170 corresponding to the second bank opening B-OP2 may be connected to the bus electrode 180 through the second opening 160OP of the intermediate layer 160 and the first opening 190OP of the insulating pattern layer 190. The second electrode 170 may come into contact with the upper surface of the intermediate layer 160, the upper surface of the portion of the insulating pattern layer 190, and the upper surface of the bus electrode 180. In this case, a contact area between the second electrode 170 and the bus electrode 180 may be a (substantially) same as an area of the first opening 190OP of the insulating pattern layer 190.

According to the embodiments described hereinabove, a display device is capable of displaying a high-quality image without degrading electrical characteristics or the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a light-emitting diode comprising a first electrode, a second electrode arranged on the first electrode, and an intermediate layer between the first electrode and the second electrode;
   a bus electrode spaced apart from the first electrode of the light-emitting diode;
   a bank layer covering an edge of the first electrode and an edge of the bus electrode, and exposing a portion of the first electrode and a portion of the bus electrode; and
   an insulating pattern layer arranged on the bus electrode, and comprising a first opening overlapping the bus electrode, wherein
   the second electrode contacts the bus electrode through the first opening of the insulating pattern layer, the intermediate layer is arranged on an upper surface of the first electrode, an upper surface of the bus electrode, and an upper surface of the bank layer, and comprises a second opening overlapping the first opening, and
   a width of the second opening of the intermediate layer is greater than a width of the first opening of the insulating pattern layer.

2. The display device of claim 1, wherein the insulating pattern layer includes an inorganic insulating material.

3. The display device of claim 1, wherein, in a plan view, an edge of the first opening is located within the second opening.

4. The display device of claim 1, wherein the second electrode contacts an upper surface of the intermediate layer, an upper surface of a portion of the insulating pattern layer surrounding an edge of the first opening, and the upper surface of the bus electrode.

5. The display device of claim 3, wherein the intermediate layer comprises an emission layer and a functional layer that includes at least one selected from a hole transport layer, a hole injection layer, an electron transport layer, and an electron injection layer, and
   the second opening penetrates through the emission layer and the functional layer.

6. The display device of claim 1, wherein the bank layer comprises a bank opening corresponding to the bus electrode, and
   a width of the bank opening is greater than a width of the first opening.

7. The display device of claim 1, wherein the first electrode and the bus electrode are located on a same layer and include a same material.

8. The display device of claim 1, further comprising a common voltage line electrically connected to the bus electrode,
   wherein the common voltage line is electrically connected to an auxiliary pattern that overlaps the common voltage line and is arranged on a different layer from the common voltage line.

9. The display device of claim 8, further comprising an auxiliary line extending in a direction crossing the common voltage line.

* * * * *

UNITED STATES PATENT AND TRADEMARK OFFICE
CERTIFICATE OF CORRECTION

PATENT NO. : 12,137,590 B2
APPLICATION NO. : 17/504444
DATED : November 5, 2024
INVENTOR(S) : Seho Lee et al.

Page 1 of 1

It is certified that error appears in the above-identified patent and that said Letters Patent is hereby corrected as shown below:

In the Claims

In Column 18, Line 18, amend Claim 5 as follows:
Replace "The display device of claim 3" with --The display device of claim 1--.

Signed and Sealed this
First Day of July, 2025

Coke Morgan Stewart
*Acting Director of the United States Patent and Trademark Office*